United States Patent [19]

Bockett-Pugh

[11] Patent Number: 4,611,302

[45] Date of Patent: Sep. 9, 1986

[54] NON-VOLATILE DATA STORES

[75] Inventor: Charles P. Bockett-Pugh, Surrey, England

[73] Assignee: Schlumberger Electronics (U.K.) Limited, Farnborough, England

[21] Appl. No.: 626,261

[22] Filed: Jun. 29, 1984

[30] Foreign Application Priority Data

Jun. 30, 1983 [GB] United Kingdom ............... 8317747

[51] Int. Cl.[4] .................................. G11C 7/00
[52] U.S. Cl. ..................................... 365/229; 365/228
[58] Field of Search .................. 365/226, 228, 229

[56] References Cited

U.S. PATENT DOCUMENTS 4,399,524  8/1983  Muguruma et al. ............... 365/229

FOREIGN PATENT DOCUMENTS 0019222  11/1980  European Pat. Off. .
0051533   5/1982  European Pat. Off. .
54-149436 11/1979  Japan .............................. 365/228
WO82/04345 12/1982  PCT Int'l Appl. .

Primary Examiner—Joseph A. Popek
Attorney, Agent, or Firm—Dale Gaudier

[57] ABSTRACT

A battery backup circuit for a CMOS RAM is isolated from the negative, or ground, power supply rail of the memory so that the memory is held at a potential which is sufficiently different from that of the normal write-enable signal (usually zero volts) to prevent spurious signals from affecting the memory.

5 Claims, 1 Drawing Figure

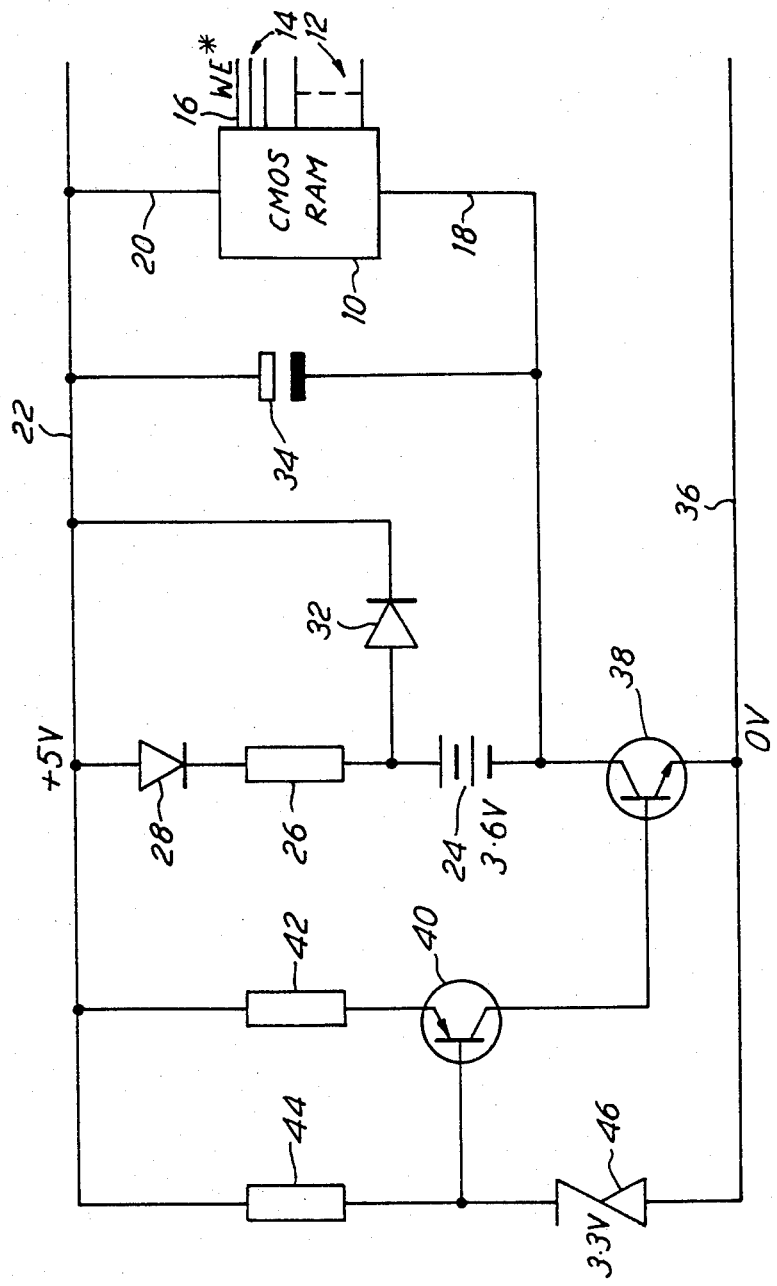

NON-VOLATILE DATA STORES

This invention relates to non-volatile read/write data stores, that is to data stores the contents of which can be altered and which are capable of retaining data in the absence of the normal operating power supply.

One simple way of implementing such a store is to connect a battery (for example a rechargeable nickel-cadmium battery) in parallel with the normal power supply across the power inputs of the store. The store itself is preferably a CMOS random-access memory (RAM) which is characterised by a very low standby current requirement. Although such an arrangement provides the basic function desired, it suffers from a serious disadvantage. A typical CMOS RAM includes a control terminal to determine whether any given memory access operation is to read data from the memory or to write data into it. A write operation is in many cases signified by a low (negative-going) signal on the control terminal, provided for example by connecting the terminal to the ground potential of the memory and the circuit containing it. In the event of a power supply failure or interruption, other parts of the circuit may temporarily continue operating as the supply voltage falls, but in an unpredictable and unreliable manner. The consequently aberrant operation may include spurious attempts to write into the memory. Since the write control signal is a low voltage signal (that is, absence of the power supply voltage), the failure of the power supply does not of itself preclude the application of an apparent write control (ground) signal to the memory, the contents of which may thus be overwritten and corrupted.

According to one aspect of this invention there is provided a non-volatile data store, comprising volatile data storage means, power terminals for receiving power from a power source, and a battery for maintaining energisation of the storage means upon interruption of the power supply from the power source, the storage means having a control terminal for receiving a control signal of predetermined polarity to enable data transfer with the storage means, wherein a power input of the storage means and a power output of the battery, each having said predetermined polarity, are selectively connectable to the corresponding one of the power terminals, and are arranged to be disconnected therefrom upon interruption of the supply from the power source.

With such an arrangement, in the event of power failure, the battery has the additional effect of maintaining the disconnectable power input of the storage means (such as a CMOS RAM), whose potential defines a write control signal, at a potential several volts different from the circuit power terminal to which it is normally coupled. Accordingly, any spurious circuit operation which results in the potential of the circuit power terminal being applied to the read/write control terminal of the memory (and which could thus otherwise result in a spurious write operation) has no effect, since the write control terminal adopts a potential several volts different from that of the disconnectable power input of the memory, and thus does not enable a write operation.

A non-volatile data store in accordance with this invention will now be described, by way of example, with reference to the accompanying drawing, which shows a circuit diagram of the store.

Referring to the drawing, a CMOS RAM 10 has data and address lines 12, control lines 14 including a NOT-WRITE-ENABLE (WE*) line 16, a 0 V power line 18 and a +5 V power line 20.

The +5 V line 20 is coupled to a +5 V line 22 of the system containing the data store, and the 0 V line 18 is connected to the negative terminal of a 3.6 V rechargeable nickel-cadmium battery 24. The positive terminal of this battery is coupled to the system +5 V line 22 via a resistor 26 and a diode 28 which provide trickle-charging for the battery 24 when the system +5 V line 22 is energised, and also via a diode 32 connected in parallel with the resistor 26 and diode 28 and in opposite polarity to the diode 28. An electrolytic capacitor 34 is coupled across the power lines 18 and 20 of the RAM 10.

The RAM 0 V line 18 is connectable to the system 0 V (ground) line 36 via the collector-emitter circuit of an NPN transistor 38, the base of which is energised by the collector of a PNP transistor 40. The emitter and base of this PNP transistor are coupled to the system +5 V line 22 by respective resistors 42 and 44, and the base is coupled to the system 0 V line 36 via a reverse-biased 3.3 V zener diode 46.

In normal operation, the potential difference across the resistor 44 keeps the transistor 40 on, and this transistor in turn supplies base current to the transistor 38 to keep it on. Since an active CMOS RAM requires several tens of milliamps of operating current, which must be conducted by the transistor 38, the component values are chosen to provide a base current of several milliamps.

Owing to the normal very low emitter-collector voltage drop of the transistor 38 when it is on, the RAM 0 V line 18 is at virtually the same potential as the system 0 V line 36. Logic 0 signals (at system 0 V potential) applied to the RAM lines 12 and 14 by circuitry elsewhere in the system, including write enable signals on the WE* line 16, therefore have their normal effect on the operation of the RAM 10. The battery 24 is maintained charged by current flowing through the resistor 26 and diode 28. The capacitor 34 is held charged to the full potential (+5 V) of the system power supply.

In the event of power supply interruption, the voltage of the system +5 V line 22 starts to fall. Because the voltage across a capacitor cannot change instantaneously, the capacitor 34 causes the voltage of the RAM 0 V line 18 to fall in step with that on the line 22. The capacitor 34 also acts as a reservoir to provide current to the RAM 10 and to the transistor 38 (the base-collector junction of which becomes temporarily forward biassed as the voltage of the line 18 falls).

The voltage on line 18 continues to drop to several volts negative of the line 36, until the voltage of the supply line 22 has more or less stabilised. Thereafter the voltage of the line 18 slowly rises again, as the capacitor 34 discharges, until the voltage across the capacitor is low enough for the diode 32 to become forward-biassed by the battery 24, which then supplies current in place of the capacitor 34. At this point the voltage of the line 18 stabilises at a voltage, relative to the line 36, of around −3.2 V (3.6 V minus the 0.4 V drop across the diode 32 at a current of the order of 1 μA).

The zener diode 46 ensures that by the time this happens, the transistor 40, and thus the transistor 38, are fully turned off. Thus, even if the supply line 22 does not fall completely to zero, there is no current flow through the transistor 38 and the battery 24 only has to sustain the very small current requirement of the RAM 10.

Since the line 18 is more than 2.4 V negative of the line 36, any signal at the potential of the line 36 (which would normally be applied as a write enable signal to the WE* input 16) will in fact appear to be at a potential, relative the RAM ground line 18, of at least 2.4 V positive. As this is defined as an unambiguous logic high, it is ineffective to enable the RAM for writing.

I claim:

1. A non-volatile data store, comprising volatile data storage means, power terminals for receiving power from a power source, and a battery for maintaining energisation of the storage means upon interruption of power from the power source, the storage means having a control terminal for receiving a control signal of predetermined polarity for enabling data transfer with the storage means in response to said control signal, wherein a power input of the storage means and a power output of the battery, each having said predetermined polarity, are selectively connectable to the corresponding one of the power terminals, and are arranged to be disconnected therefrom upon interruption of power from the power source.

2. A non-volatile data store as claimed in claim 1 where the control signal has a potential which is fixed relative to the power terminals and arranged such that when disconnected said power input of the storage means and said power output of the battery float relative to said power supply terminal so that during a power supply failure said input and said output float in potential with a polarity opposite that of the enabling control signal between said control terminal and said power terminal.

3. A non-volatile data store as claimed in claim 1 wherein the storage means includes a pair of power inputs and a capacitor connected across the power inputs.

4. A non-volatile data store as claimed in claim 1 wherein a transistor is arranged to provide a conductive path between said power input of said storage means and said power output of said battery and said corresponding power terminal, respectively, the transistor being controlled to become non-conductive upon interruption of the supply from the power source.

5. A non-volatile data store as claimed in claim 1 wherein said predetermined polarity is negative.

* * * * *